(12) United States Patent
Ono et al.

(10) Patent No.: US 8,664,117 B2
(45) Date of Patent: Mar. 4, 2014

(54) METHOD FOR MANUFACTURING SEMICONDUCTOR DEVICE USING ANISOTROPIC ETCHING

(75) Inventors: Katsuyuki Ono, Yamanashi (JP); Yusuke Hirayama, Yamanashi (JP); Hideyuki Hatoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/582,536

(22) PCT Filed: Mar. 4, 2011

(86) PCT No.: PCT/JP2011/001280
§ 371 (c)(1),
(2), (4) Date: Oct. 11, 2012

(87) PCT Pub. No.: WO2011/108280
PCT Pub. Date: Sep. 9, 2011

(65) Prior Publication Data
US 2013/0052821 A1   Feb. 28, 2013

(30) Foreign Application Priority Data

Mar. 5, 2010   (JP) ................... 2010-049833

(51) Int. Cl.
*H01L 21/44*   (2006.01)
(52) U.S. Cl.
USPC ............ 438/675; 438/700; 257/622; 257/774
(58) Field of Classification Search
USPC ......... 438/687, 631, 633, 638, 643, 688, 634, 438/635, 636, 637, 639, 640, 642, 644, 645, 438/647, 652, 653, 654, 678, 685, 689, 690, 438/691, 700, 42, 98, 571, 597, 612, 672, 438/675; 257/758, 774, 775, 776, 618, 622
See application file for complete search history.

(56) References Cited

U.S. PATENT DOCUMENTS

| | | | |
|---|---|---|---|
| 5,063,176 A * | 11/1991 | Lee et al. ................. | 438/297 |
| 6,833,079 B1 | 12/2004 | Giordani | |
| 2005/0167812 A1 | 8/2005 | Yoshida et al. | |
| 2009/0176375 A1* | 7/2009 | Benson et al. ............. | 438/719 |

FOREIGN PATENT DOCUMENTS

| | | |
|---|---|---|
| JP | 11-031678 A | 2/1999 |
| JP | 2003-533869 A | 11/2003 |
| JP | 2008-153275 A | 7/2008 |
| WO | 2004/064159 A1 | 7/2004 |

OTHER PUBLICATIONS

International Search Report for PCT/JP2011/001280 dated May 24, 2011.

* cited by examiner

*Primary Examiner* — Thanh Y Tran
(74) *Attorney, Agent, or Firm* — Pearne & Gordon LLP

(57) ABSTRACT

Provided is a semiconductor device manufacturing method enabling miniaturization by forming a hole in a vertical shape, capable of reducing the number of processes as compared to conventional methods, and capable of increasing productivity. The semiconductor device manufacturing method includes: forming a hole in a substrate; forming a polyimide film within the hole; anisotropically etching the substrate without using a mask covering a sidewall portion of the polyimide film within the hole and removing at least a part of a bottom portion of the polyimide film within the hole while the sidewall portion of the polyimide film remains within the hole; and filling the hole with a conductive metal.

10 Claims, 4 Drawing Sheets

METHOD FOR MANUFACTURING SEMICONDUCTOR DEVICE USING ANISOTROPIC ETCHING

CROSS-REFERENCE TO RELATED APPLICATION

This Application is a U.S. national phase application under 35 U.S.C. §371 of PCT Application No. PCT/JP2011/001280 filed on Mar. 4, 2011, which claims the benefit of Japanese Patent Application No. 2010-049833 filed on Mar. 5, 2010, the entire disclosures of which are incorporated herein by reference.

TECHNICAL FIELD

The present invention relates to a method for manufacturing a semiconductor device.

BACKGROUND ART

In semiconductor device manufacturing field, there have been many attempts to increase an integration density by means of miniaturization. Recently, there have been many attempts to increase an integration density per unit area by a method of stacking semiconductor devices which is called "three-dimensional packaging".

Vertically stacked semiconductor devices (chips) include an electrode formed by penetrating a substrate and the semiconductor devices are electrically connected to each other via the electrode. When forming the electrode that penetrates the substrate, it is necessary to remove only a bottom portion of an insulating film formed within a hole perforated on the substrate while a sidewall portion of the insulating film remains.

As a method for removing only a bottom portion of an insulating film formed within a hole while a sidewall portion of the insulating film remains as described above, there is known a method that includes: forming a tapered hole in a substrate; attaching a tape onto a surface of the substrate; forming, in the tape, a hole having a diameter smaller than the tapered hole; and etching an insulating film formed at a bottom portion of the tapered hole through the hole in the tape (see, for example, Patent Document 1).

Further, there is known a method that includes: coating a sidewall portion of an insulating film formed within a hole with photoresist; and removing a bottom portion of the insulating film by etching.

Patent Document 1: PCT Publication No. 2004/064159

DISCLOSURE OF THE INVENTION

Problems to Be Solved by the Invention

In the above-described method including: attaching a tape onto a surface of a substrate; and forming a hole, in the tape, having a diameter smaller than a hole formed in the substrate, the hole in the substrate needs to be formed in a tapered shape. Thus, it is difficult to apply this method to a vertical shaped hole in a substrate. For this reason, there is a limit to miniaturization, and there are needed high accuracy processes for attaching the tape, and forming the hole in the tape, and thus, it is difficult to increase productivity.

Further, in the method that includes coating a sidewall portion of an insulating film formed within a hole with photoresist and removing a bottom portion of the insulating film by etching, a photoresist coating process and a developing process are needed, and thus, it is also difficult to increase productivity.

In view of the foregoing, illustrative embodiments provide a semiconductor device manufacturing method enabling miniaturization by forming a hole in a vertical shape, and capable of reducing number of required processes as compared to conventional methods, and capable of increasing productivity.

Means for Solving the Problems

In accordance with an illustrative embodiment of a semiconductor device manufacturing method, there is provided a semiconductor device manufacturing method, including: forming a hole in a substrate; forming a polyimide film within the hole; anisotropically etching the substrate without using a mask covering a sidewall portion of the polyimide film within the hole and removing at least a part of a bottom portion of the polyimide film within the hole while the sidewall portion of the polyimide film remains within the hole; and filling the hole with a conductive metal.

Effect of the Invention

In accordance with an illustrative embodiment, it is possible to provide a semiconductor device manufacturing method enabling miniaturization by forming a hole in a vertical shape, capable of reducing the number of processes as compared to conventional methods, and capable of increasing productivity.

BEST MODE FOR CARRYING OUT THE INVENTION

Hereinafter, illustrative embodiments of the present invention will be described in detail with reference to the accompanying drawings.

Figure 1:
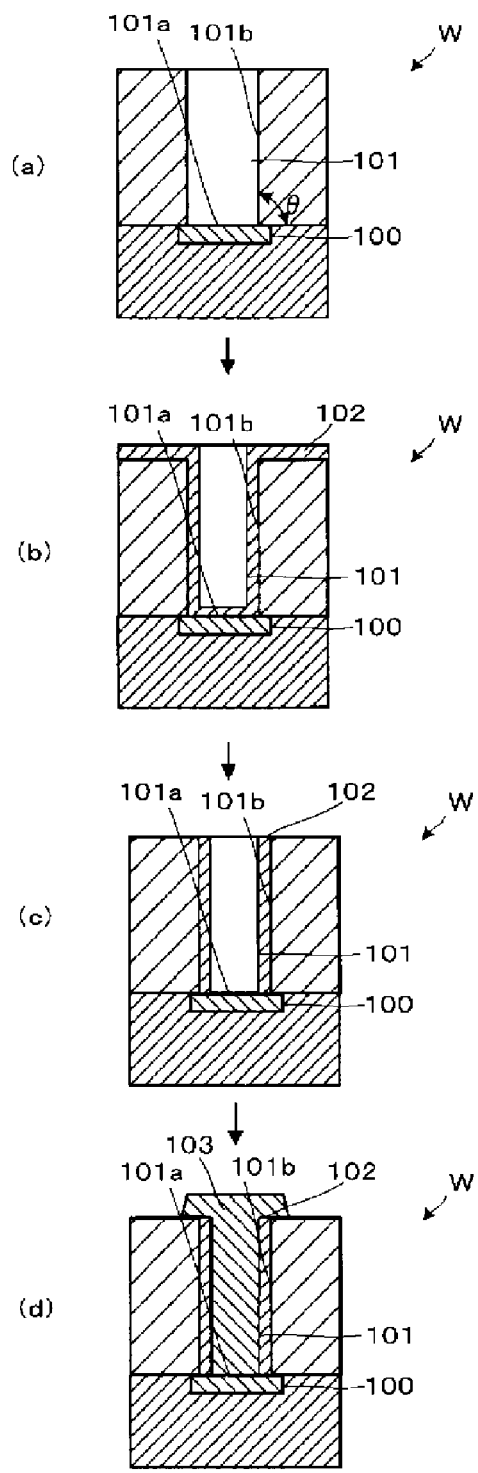
FIG. 1 is provided to explain a process in accordance with an illustrative embodiment.
Figure 2:
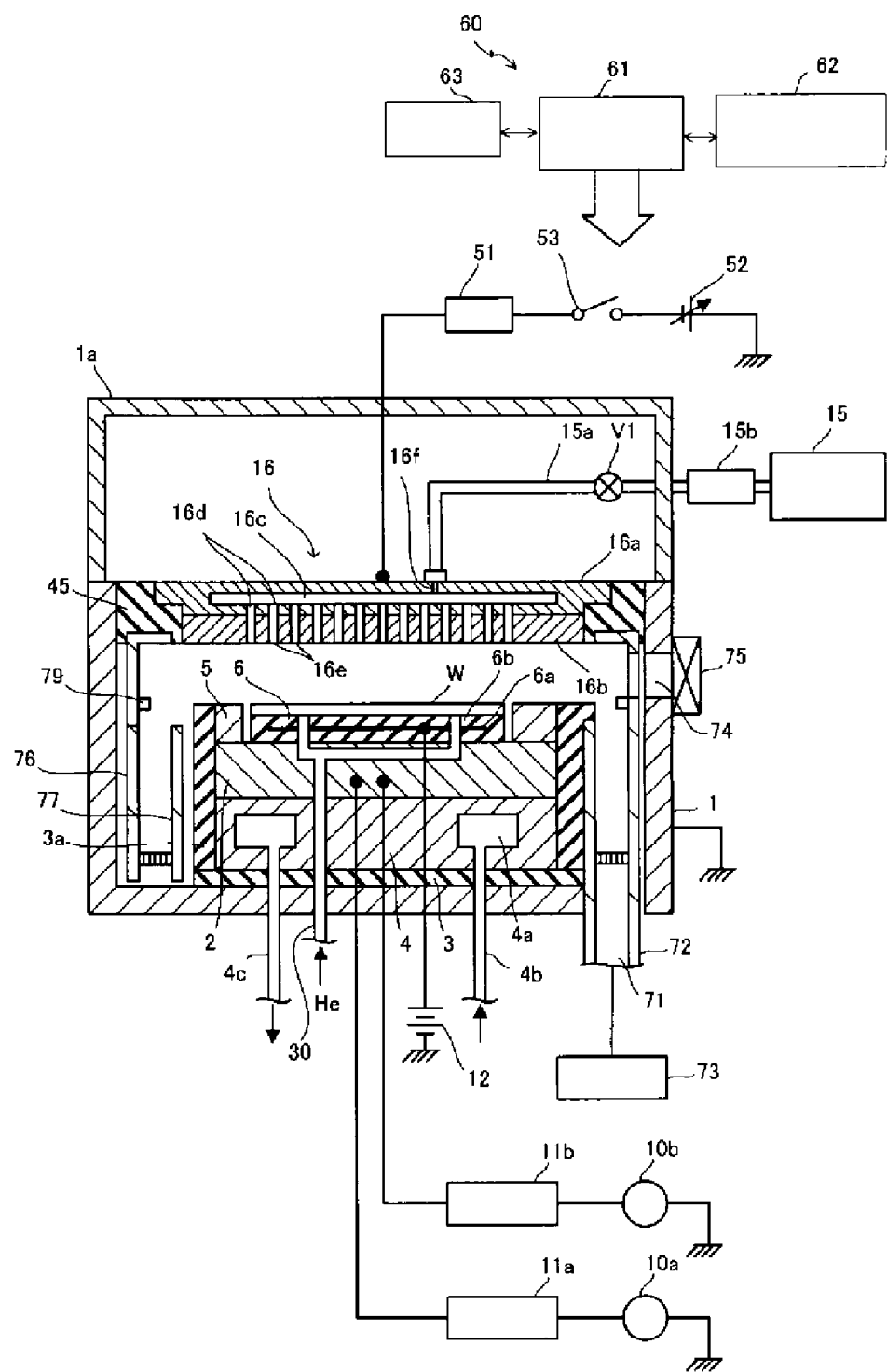
FIG. 2 illustrates a configuration of a plasma etching apparatus used in an illustrative embodiment.

FIG. 1 schematically illustrates an enlarged cross section of a main portion of a semiconductor wafer W as a processing target substrate to show a process of the present illustrative embodiment. Further, FIG. 2 schematically illustrates a cross section of a plasma etching apparatus in accordance with the present illustrative embodiment.

Above all, a configuration of the plasma etching apparatus will be explained with reference to FIG. 2.

The plasma etching apparatus includes a processing chamber 1 that is airtightly sealed and electrically grounded. The processing chamber 1 has a cylindrical shape and is made of, e.g., aluminum. A mounting table 2 for horizontally mounting thereon the wafer W as a processing target substrate is provided in the processing chamber 1. The mounting table 2 is made of, e.g., aluminum and serves as a lower electrode. The mounting table 2 is supported on a conductive support 4 on an insulating plate 3. Further, a focus ring 5 is installed at an upper periphery of the mounting table 2. Furthermore, a cylindrical inner wall member 3a made of, e.g., quartz is installed to surround the mounting table 2 and the support 4.

The mounting table 2 is connected with a first RF power supply 10a via a first matching unit 11a and also connected with a second RF power supply 10b via a second matching unit 11b. The first RF power supply 10a is used for generating plasma, and a high frequency power of a certain frequency (equal to or higher than 27 MHz, e.g., 100 MHz) is supplied from the first RF power supply 10a to the mounting table 2. Further, the second RF power supply 10b is used for attracting ions (bias power), and a high frequency power of a certain frequency (equal to or lower than 13.56 MHz, e.g., 13.56 MHz) lower than the frequency of the first RF power supply 10a is supplied from the second RF power supply 10b to the mounting table 2. Furthermore, above the mounting table 2, a shower head 16 serving as an upper electrode is disposed to face the mounting table 2 in parallel. The shower head 16 and the mounting table 2 serve as a pair of electrodes (an upper electrode and a lower electrode, respectively).

An electrostatic chuck 6 for electrostatically attracting and holding the semiconductor wafer W is provided on a top surface of the mounting table 2. The electrostatic chuck 6 includes an electrode 6a embedded in an insulator 6b, and the electrode 6a is connected with a DC power supply 12. The semiconductor wafer W is attracted to the electrostatic chuck 6 by a Coulomb force generated by applying a DC voltage to the electrode 6a from the DC power supply 12.

A coolant path 4a is formed within the support 4, and a coolant inlet pipe 4b and a coolant outlet pipe 4c are coupled to the coolant path 4a. By circulating a coolant such as cooling water through the coolant path 4a, the support 4 and the mounting table 2 can be controlled to have a certain temperature. Further, a backside gas supply pipe for supplying a cold heat transfer gas (backside gas) such as a helium gas toward a rear side of the semiconductor wafer W is formed through the mounting table 2. This backside gas supply pipe 30 is connected to a non-illustrated backside gas supply source. With this configuration, the semiconductor wafer W attracted to and held on the top surface of the mounting table 2 by the electrostatic chuck 6 can be controlled to have a certain temperature.

The shower head 16 is provided in a ceiling wall of the processing chamber 1. The shower head 16 includes a main body 16a and a top plate 16b serving as an electrode plate. The shower head 16 is supported at a top portion of the processing chamber 1 via an insulation member 45. The main body 16a is made of a conductive material such as aluminum a surface of which is anodically oxidized. The top plate 16b is detachably supported on a bottom portion of the main body 16a.

A gas diffusion space 16c is formed within the main body 16a, and a multiple number of gas through holes 16d are formed in a bottom portion of the main body 16a to be located under the gas diffusion space 16c. Further, gas inlet holes 16e are formed through the top plate 16b in a thickness direction thereof to be connected with the gas through holes 16d, respectively. With this configuration, a processing gas supplied into the gas diffusion space 16c is dispersed and introduced into the processing chamber 1 via the gas through holes 16d and the gas inlet holes 16e, as in a shower device. A non-illustrated pipe for circulating a coolant is provided in the main body 16a and so forth, and thus, the shower head 16 can be cooled to a desired temperature during a plasma etching process.

The main body 16a is provided with a gas inlet 16f through which the processing gas is introduced into the gas diffusion space 16c. The gas inlet 16f is connected to a gas supply pipe 15a, and the other end of the gas supply pipe 15a is connected to a processing gas supply source 15 that supplies a processing gas for etching. A mass flow controller (MFC) 15b and an opening/closing valve V1 are provided on the gas supply pipe 15a in sequence from the upstream side. A processing gas for plasma etching is supplied from the processing gas supply source 15 into the gas diffusion space 16c via the gas supply pipe 15a. Then, the processing gas is dispersed and supplied into the processing chamber 1 via the gas through holes 16d and the gas inlet holes 16e from the gas diffusion space 16c, as in a shower device.

A variable DC power supply 52 is electrically connected to the shower head 16 as the upper electrode via a low pass filter (LPF) 51. A power supply of the variable DC power supply 52 is on-off controlled by an on/off switch 53. A current and a voltage of the variable DC power supply 52 and an on/off operation of the on/off switch 53 are controlled by a control unit 60 to be described later. When plasma is generated in a processing space by applying the high frequency powers from the first RF power supply 10a and the second RF power supply 10b to the mounting table 2, the on/off switch 53 is turned on by the control unit 60, if necessary, so that a certain DC voltage is applied to the shower head 16 serving as the upper electrode.

A cylindrical ground conductor 1a is extended upwards from a sidewall of the processing chamber 1 to be located at a position higher than the shower head 16. The cylindrical ground conductor 1a has a ceiling wall at the top thereof.

A gas exhaust port 71 is formed in a bottom portion of the processing chamber 1, and a gas exhaust device 73 is connected to the gas exhaust port 71 via a gas exhaust pipe 72. The gas exhaust device 73 has a vacuum pump, and the inside of the processing chamber 1 can be depressurized to a certain vacuum level by operating the vacuum pump. Further, a loading/unloading port 74 for the semiconductor wafer W is formed at a sidewall of the processing chamber 1, and a gate valve 75 for opening and closing the loading/unloading port 74 is provided at the loading/unloading port 74.

Reference numerals 76 and 77 in FIG. 2 denote detachable deposition shields. The deposition shield 76 is provided along an inner wall surface of the processing chamber 1 to prevent etching byproducts (deposits) from adhering to the processing chamber 1. A conductive member (GND block) 79, which is DC-connected to the ground, is provided at the deposition shield 76 to be located at the substantially same height as the semiconductor wafer W. With this configuration, an abnormal electric discharge can be prevented.

The overall operation of the plasma etching apparatus configured as described above is controlled by the control unit 60. The control unit 60 includes a process controller 61, having a CPU, for controlling individual parts of the plasma etching apparatus; a user interface 62; and a storage unit 63.

The user interface 62 includes a keyboard through which a process manager inputs a command to manage the plasma etching apparatus; a display for visually displaying an operational status of the plasma etching apparatus; and so forth.

The storage unit 63 stores therein control programs (software) for implementing various processes performed in the plasma etching apparatus under the control of the process controller 61 or recipes including processing condition data and the like. In response to an instruction from the user interface 62 or the like, a necessary recipe is retrieved from the storage unit 63 and executed by the process controller 61, so that a desired process is performed in the plasma etching apparatus under the control of the process controller 61. The control programs and the recipes including the processing condition data can be read out from a computer-readable storage medium (e.g., a hard disk, a CD, a flexible disk, a semiconductor memory, or the like), or can be used on-line by being received from another apparatus through, e.g., a dedicated line, whenever necessary.

Hereinafter, there will be explained a sequence for performing a plasma etching process on a polyimide film formed on a bottom portion of a hole, which will be described later, in the semiconductor wafer W of the plasma etching apparatus configured as described above. First, the gate valve 75 is opened, and the semiconductor wafer W is loaded by a non-illustrated transfer robot or the like into the processing chamber 1 through the loading/unloading port via a non-illustrated load lock chamber, and the semiconductor wafer W is mounted on the mounting table 2. Then, the transfer robot is retreated from the processing chamber 1, and the gate valve 75 is closed. Subsequently, the processing chamber 1 is evacuated through the gas exhaust port 71 by the vacuum pump of the gas exhaust device 73.

When the inside of the processing chamber 1 reaches a certain vacuum level, a processing gas (an etching gas) is supplied into the processing chamber 1 from the processing gas supply source 15, and the inside of the processing chamber 1 is maintained at a certain pressure. In this state, a high frequency power having a frequency of, e.g., 100 MHz is applied to the mounting table 2 from the first RF power supply 10a. Further, a high frequency (bias) power having a frequency of, e.g., 13.56 MHz is applied to the mounting table 2 from the second RF power supply 10b to attract ions. At this time, a DC voltage is applied from the DC power supply 12 to the electrode 6a of the electrostatic chuck 6, so that the semiconductor wafer W is attracted to and held on the electrostatic chuck 6 by a Coulomb force.

As described above, by applying the high frequency powers to the mounting table 2 serving as the lower electrode, an electric field is formed between the shower head 16 serving as the upper electrode and the mounting table 2 serving as the lower electrode. An electric discharge is generated in the processing space in which the semiconductor wafer W is located. As a result, plasma of the processing gas is generated, and the polyimide film formed on the semiconductor wafer W by the plasma of the processing gas is anisotropically etched by means of RIE.

Upon the completion of the above-described etching process, the supplies of the high frequency powers, the DC voltage and the processing gas are stopped, and the semiconductor wafer W is unloaded from the processing chamber 1 in a reverse sequence to the above-described sequence.

Hereinafter, an illustrative embodiment of a semiconductor device manufacturing method will be explained with reference to FIG. 1. The semiconductor wafer W depicted in FIG. 1 is made of silicon and provided with a semiconductor circuit, and the thickness of the semiconductor wafer W becomes thin by grinding the semiconductor wafer W from the rear side thereof. After the semiconductor wafer W is temporarily bonded to a tray or the like, the rear side thereof is turned upwards and a lithography process is performed thereon to form a hole 101 penetrating the semiconductor wafer W and reaching a wiring portion (electrode pad) 100 as depicted in FIG. 1(a).

The hole 101 has a substantially vertical sidewall. As depicted in FIG. 1(a), when viewed from a longitudinal cross section view, an angle θ formed between the sidewall and an imaginary line extended horizontally from a bottom surface is in a range of from about 88° to about 90°. As described above, in the present illustrative embodiment, the sidewall is substantially vertical, and thus, it is possible to form holes having smaller diameters with fine pitch and also possible to achieve high integration resulting from miniaturization of a semiconductor device.

Then, as depicted in FIG. 1(b), a polyimide film 102 serving as an insulating film is formed on a surface of the semiconductor wafer W including a bottom portion 101a and a sidewall portion 101b of the hole 101. For example, the polyimide film 102 can be formed by deposition polymerization. If the polyimide film 102 is formed by deposition polymerization, a co-deposition polymerization reaction occurs on the semiconductor wafer W by using monomer materials such as PMDA and ODA, so that the uniform polyimide film 102 can be formed on the semiconductor wafer W. Meanwhile, if the semiconductor wafer W is coated with a polyimide solution, a large region within the hole 101 is filled with a polyimide, which is undesirable.

Subsequently, as depicted in FIG. 1(c), while the sidewall portion of 101b the polyimide film 102 remains within the hole 101, only the bottom portion 101a of the polyimide film 102 within the hole 101 is removed by a plasma etching process. By way of example, in order to retain the insulating film on the rear surface of the semiconductor wafer W (upward surface in FIG. 1), the rear surface of the polyimide film 102 needs to be thicker than the bottom portions of the polyimide film 102 within the hole 101 or the rear surface of the polyimide film 102 needs to be masked during the etching process.

For example, the plasma etching process may include an anisotropic etching process performed by RIE (Reactive Ion Etching). The plasma etching process may be performed by using the plasma etching apparatus depicted in FIG. 2 under plasma etching conditions as follows.

Pressure: 3.33 Pa (25 mTorr)
Etching gas: $O_2$/Ar/$CF_4$=20/200/100 sccm
High frequency power (100 MHz/13.56 MHz): 400 W/600 W As the above-described plasma etching gas, it is desirable to use a mixture of a fluorine-containing gas, an inert gas, and an oxygen gas. Here, in the mixture, a flow rate of the fluorine-containing gas may be higher than a flow rate of the oxygen gas. By using the mixture, it is possible to perform an etching process with high anisotropy that is caused by fluorine ions. As the fluorine-containing gas, the above-described $CF_4$ gas may be used appropriately. Further, other carbon fluoride gases may be used.

Then, as depicted in FIG. 1(d), a conductive metal 103 is buried within the hole 101 by a coating process or the like to form an electrode that penetrates the wafer W and is electrically connected to the wiring portion 100.

Figure 3:
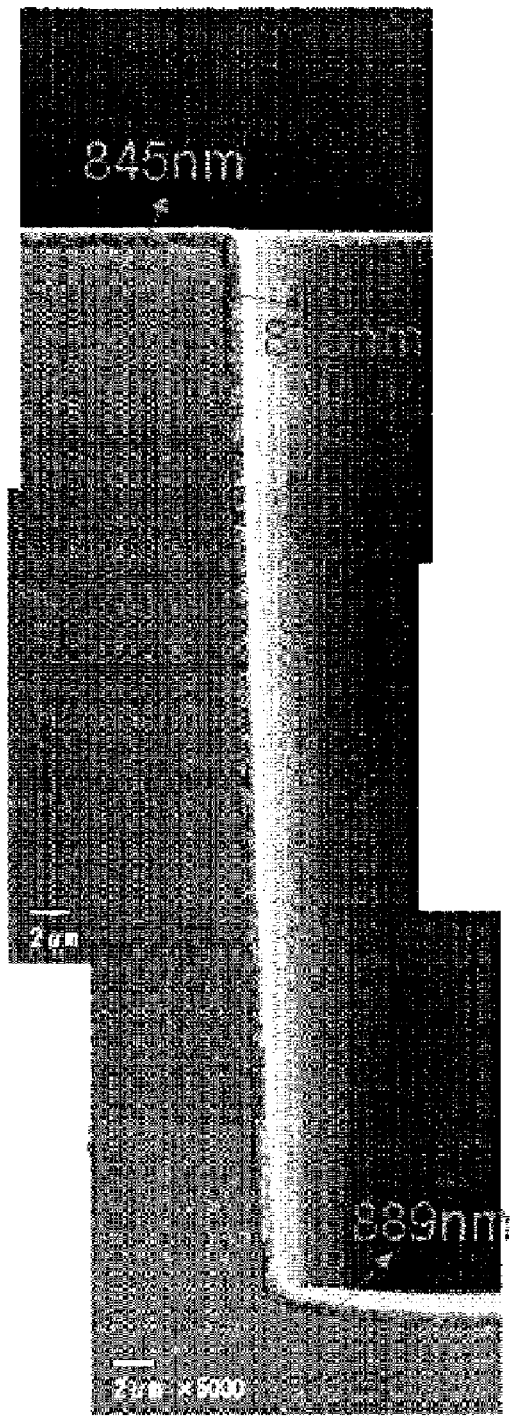
FIG. 3 is an electron micrograph of a semiconductor wafer in accordance with an example.
Figure 4:
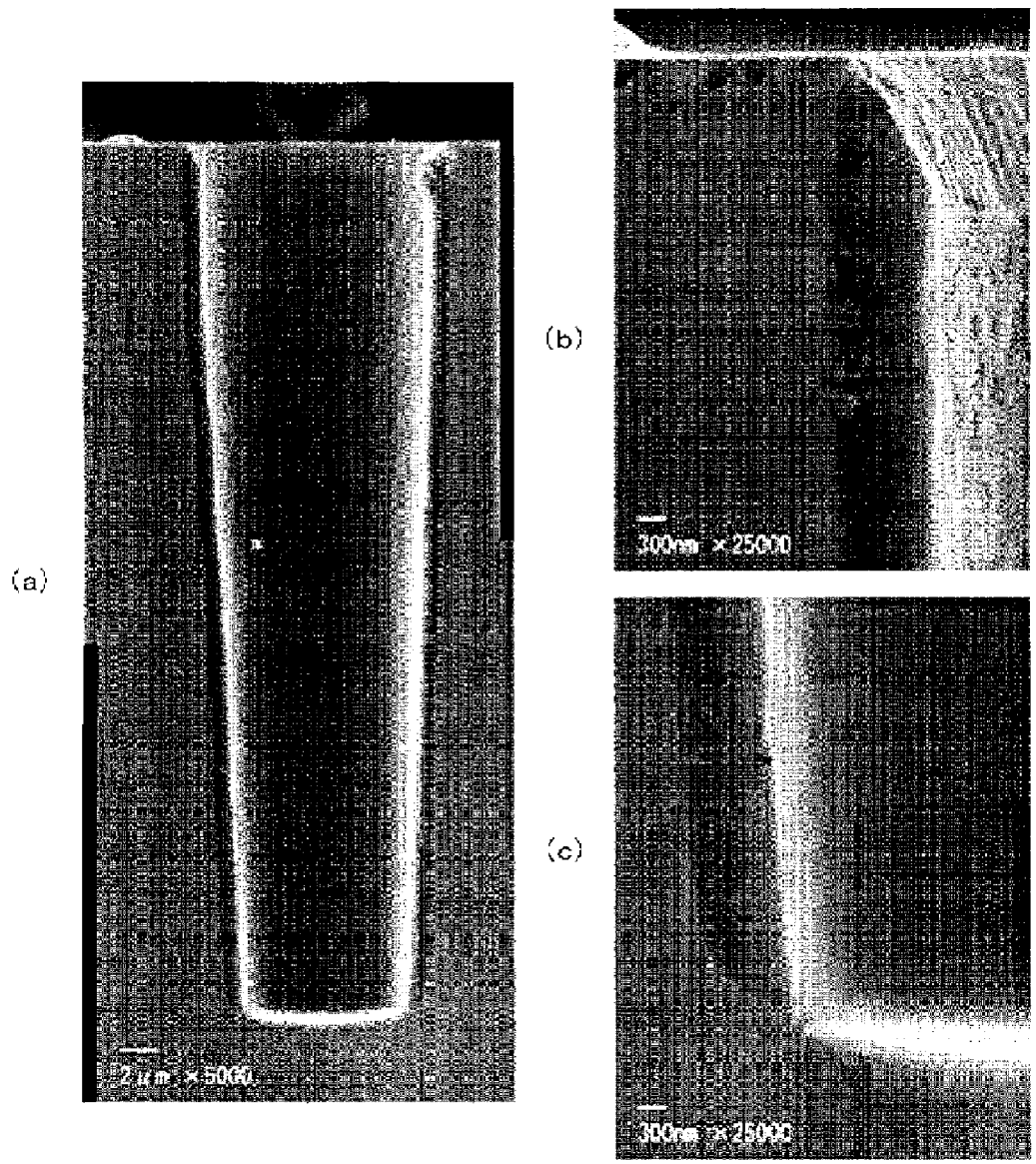
FIG. 4 is an electron micrograph of a semiconductor wafer in accordance with an example.

FIGS. 3 and 4 provide electron micrographs showing main parts of the semiconductor wafer W in accordance with an example. FIG. 3 shows a status where a polyimide film is formed on the semiconductor wafer W by deposition polymerization. In this example, as a result of measuring a thickness of the polyimide film at each portion, a film thickness on an upward surface in FIG. 3 is about 845 nm; a film thickness on a sidewall portion within a hole is about 839 nm; and a film thickness on a bottom portion in a hole is about 889 nm.

FIG. 4 shows a status where a bottom portion of a polyimide film within a hole is etched by the plasma etching apparatus depicted in FIG. 2 under the above-described etching conditions. FIG. 4(a) shows the entire hole, FIG. 4(b) shows an area near an opening of the hole, and FIG. 4(c) shows an area near a bottom portion of the hole. As shown in these electron micrographs, while a sidewall portion of a polyimide film remains within the hole, the bottom portion of the polyimide film within the hole can be removed.

As described above, according to the present illustrative embodiment and example, even if the hole 101 has a substantially vertical sidewall, only the bottom portion 101a of the hole 101 of the polyimide film 102 within the hole 101 can be removed by a plasma RIE etching process while the sidewall portion 101b of the polyimide film 102 remains within the hole 101. In the above-mentioned present illustrative embodiment and example, there is no need of providing a mask made of a photoresist layer. Further, there is no necessity of attaching a tape and forming a hole in the tape at a position corresponding to a hole in the substrate. Therefore, a three-dimensional packaging semiconductor device can be fabricated by using a smaller number of processes as compared to conventional methods, and thus, productivity can be increased.

Further, the present invention is not limited to the above-described illustrative embodiment and can be modified and changed in various ways. By way of example, the plasma etching apparatus is not limited to a plasma etching apparatus that applies two kinds of high frequency powers to a lower electrode. By way of example, the illustrative embodiment can be applied to a plasma etching apparatus that applies two kinds of high frequency powers to upper and lower electrodes or a plasma etching apparatus that applies a single frequency power to a lower electrode.

EXPLANATION OF CODES

100: Wiring portion
101: Hole
101a: Bottom portion
101b: Sidewall portion
102: Polyimide film
103: Conductive metal
W: Semiconductor wafer

What is claimed is:

1. A semiconductor device manufacturing method, comprising:
    forming a semiconductor circuit on a silicon substrate;
    grinding a rear surface of the substrate;
    turning the rear surface of the substrate upwards;
    forming a hole in the substrate by performing thereon a lithography process, the hole being oriented so as to be substantially vertical to the substrate;
    forming a polyimide film within the hole;
    anisotropically etching the substrate without using a mask covering a sidewall portion of the polyimide film within the hole and removing at least a part of a bottom portion of the polyimide film within the hole while the sidewall portion of the polyimide film remains within the hole; and
    filling the hole with a conductive metal.

2. The semiconductor device manufacturing method of claim 1, wherein the anisotropically etching step is performed by using a plasma etching apparatus that is configured to apply a high frequency power between a lower electrode serving as a mounting table for mounting thereon the substrate and an upper electrode arranged to face the lower electrode,
    the anisotropically etching step is performed by using an etching gas that is a mixture of a fluorine-containing gas, an inert gas and an oxygen gas,
    in the mixture, a flow rate of the fluorine-containing gas is higher than a flow rate of the oxygen gas, and
    the anisotropically etching step is performed by applying a bias power for attracting ions to the lower electrode.

3. The semiconductor device manufacturing method of claim 2, wherein the fluorine-containing gas is $CF_4$ gas and the inert gas is Ar gas.

4. The semiconductor device manufacturing method of claim 2, wherein a first high frequency power and a second high frequency power for attracting ions are applied to the lower electrode, and
    the second high frequency power has lower frequency than the first high frequency power.

5. The semiconductor device manufacturing method of claim 1, wherein the forming a polyimide film is performed by deposition polymerization, in which a co-deposition polymerization reaction occurs on the substrate by using monomer materials such as PMDA and ODA.

6. A semiconductor device manufacturing method, comprising:
    forming a semiconductor circuit on a silicon substrate;
    grinding a rear surface of the substrate;
    turning the rear surface of the substrate upwards;
    forming a hole in the substrate by performing thereon a lithography process, the hole being oriented so as to be substantially vertical to the substrate;
    forming a polyimide film within the hole; and
    anisotropically etching the substrate without using a mask covering a sidewall portion of the polyimide film within the hole and removing at least a part of a bottom portion of the polyimide film within the hole while the sidewall portion of the polyimide film remains within the hole.

7. The semiconductor device manufacturing method of claim 6, wherein the anisotropically etching step is performed by using a plasma etching apparatus that is configured to apply a high frequency power between a lower electrode serving as a mounting table for mounting thereon the substrate and an upper electrode arranged to face the lower electrode,
    the anisotropically etching step is performed by using an etching gas that is a mixture of a fluorine-containing gas, an inert gas and an oxygen gas,
    in the mixture, a flow rate of the fluorine-containing gas is higher than a flow rate of the oxygen gas, and
    the anisotropically etching step is performed by applying a bias power for attracting ions to the lower electrode.

8. The semiconductor device manufacturing method of claim 7, wherein the fluorine-containing gas is $CF_4$ gas and the inert gas is Ar gas.

9. The semiconductor device manufacturing method of claim 7, wherein a first high frequency power and a second high frequency power for attracting ions are applied to the lower electrode, and
    the second high frequency power has lower frequency than the first high frequency power.

10. The semiconductor device manufacturing method of claim 6, wherein the forming a polyimide film is performed by deposition polymerization, in which a co-deposition polymerization reaction occurs on the substrate by using monomer materials such as PMDA and ODA.

* * * * *

UNITED STATES PATENT AND TRADEMARK OFFICE
CERTIFICATE OF CORRECTION

PATENT NO. : 8,664,117 B2
APPLICATION NO. : 13/582536
DATED : March 4, 2014
INVENTOR(S) : Katsuyuki Ono It is certified that error appears in the above-identified patent and that said Letters Patent is hereby corrected as shown below:

In the specification, column 5, line 12, please add - 74 - between "port" and "via"

Signed and Sealed this
Twenty-second Day of July, 2014

Michelle K. Lee
*Deputy Director of the United States Patent and Trademark Office*